May 27, 1952

H. N. FRIHART ET AL
TELEVISION TUNING APPARATUS WITH
CHANNEL SELECTING SWITCH 2,598,247

Filed Oct. 9, 1948

4 Sheets-Sheet 1

INVENTORS.
Henry Neil Frihart
Edwin B. Hassler
BY
Norman L. Mueller
Atty.

INVENTORS.
Henry Neil Frihart
Edwin B. Hassler
BY
Foorman L. Mueller
Atty.

INVENTORS.
Henry Neil Frihart
Edwin B. Hassler
BY
Norman L. Mueller
Atty.

May 27, 1952

H. N. FRIHART ET AL 2,598,247

TELEVISION TUNING APPARATUS WITH
CHANNEL SELECTING SWITCH

Filed Oct. 9, 1948

4 Sheets-Sheet 4

INVENTORS.
Henry Neil Frihart
Edwin B. Hassler
BY
Freeman L. Mueller
Atty.

Patented May 27, 1952

2,598,247

UNITED STATES PATENT OFFICE 2,598,247

TELEVISION TUNING APPARATUS WITH CHANNEL SELECTING SWITCH

Henry Neil Frihart, Brookfield, and Edwin B. Hassler, Chicago, Ill., assignors to Motorola, Inc., Chicago, Ill., a corporation of Illinois Application October 9, 1948, Serial No. 53,704

20 Claims. (Cl. 250—40)

This invention relates to tuners of the type employed in television receivers for making selections of stations or frequency channels.

In a television receiver it is customary to tune the set to the various stations by manipulating a rotary step switch having positions respectively corresponding to the various channels. As the television channels are in two different frequency ranges, the various tuned circuits, that is, antenna coupling circuits, radio frequency tuned circuits and oscillator circuits must be adapted to be tuned to various frequencies in these two ranges.

One of the difficulties encountered in the design of television tuners is the elimination of stray reactance effects. This is particularly objectionable in the coupling capacitor which is employed in conjunction with a plurality of tuning inductors, and which must be connected by leads to the inductors. In such cases, the leads from the capacitor may entail stray inductances which affect the bandwidth and, therefore, the performance of the receiver. Another difficulty is to provide antenna coupling circuits which do not require switching and which provide good coupling and satisfactory impedance matching.

Generally, the tuning elements in the various channels of the set are not perfectly adjusted, so that some additional fine tuning is desirable. It would be impractical, however, to supply each separate channel with an individual vernier, as this would unduly complicate the manual controls of the set. Hence, the vernier should be common to all channels. Heretofore, considerable difficulty has been encountered in devising a vernier which will not be cumbersome or introduce unwanted stray reactances into the tuning circuit.

An object of this invention is to provide a television tuner having an antenna circuit which provides a high degree of coupling and good impedance matching when operating at any channel in either television frequency range.

Another object of the present invention is to provide a tuner having a novel arrangement of tuning inductors and coupling capacitors wherein the capacitive elements have extremely small inductance so as to substantially eliminate the effects of stray reactances which usually are involved in such connections.

Still another object is to provide an improved, extremely low-cost, fixed coupling capacitor unit common to a plurality of frequency channels and adapted to extend in proximity and be directly connected to a plurality of tuning inductors at spaced points along its extent.

A further object is to provide a novel trimmer for the tuner which is common to all channels and which does not introduce any appreciable stray reactance into the tuning circuits.

A still further object is to make the main tuning and vernier controls concentric with respect to each other so that the knobs for operating these controls are convenient to use and need not occupy separate positions on the instrument panel.

A feature of this invention is the provision of an antenna coupling circuit including separate, series connected, high and low frequency secondaries each including a pair of parallel connected coupling coils, with the circuit being arranged so that the two secondaries do not interfere with each other.

As another feature of the invention, there is provided an annular fixed capacitor unit disposed on a cylindrical member which supports tuning inductors arranged at spaced points around its periphery. The capacitor unit has one or more annular outer plates and one or more segmental inner plates insulated therefrom by a suitable dielectric. At spaced points on the periphery of the capacitor unit connections are made directly to the adjacent tuning inductors without the necessity of using long leads, inasmuch as the inductors are disposed in proximity to the capacitor unit.

A further feature of the invention is the use of a tuner having a coaxial shaft assembly in which one shaft is employed to manipulate a rotary step switch for effecting the station selection, and the other shaft produces relative axial movement of the plates of a trimmer capacitor disposed on the shaft assembly, thereby to adjust the capacitance of this trimmer.

Another feature is the use of a rotary conductive element mounted on the shaft assembly as a common part of both the station-selecting switch and the trimmer.

The foregoing and other objects, features and advantages of the invention will be better understood by reference to the following detailed description taken in connection with the accompanying drawings, wherein.

In practicing the invention there is provided a tuner for a television receiver adapted to receive channels in two different frequency ranges. Coupling is provided between an antenna and the radio frequency amplifier through a coupling transformer having a primary including a pair of series connected coils and separate secondaries for the frequency ranges each including a pair of parallel connected coils. A pair of forms are used with one coil of each pair being supported on each form. The two secondaries are connected in series, with the low frequency secondary being effectively grounded during high frequency operation. The radio frequency amplifier output circuit is tuned by a plurality of inductors selected by a station selecting switch.

The inductors are disposed radially at spaced points around the periphery of the cylindrical support member which also supports a coupling capacitor unit containing two fixed capacitors, each of which is common to the channels in one frequency range. The capacitor unit has annular outer plates which are disposed on and supported by the aforesaid cylindrical member and segmental inner plates which are insulatingly secured to the outer plates. The leads from the tuning inductors are soldered directly to the inner plates at points respectively adjacent to these inductors.

The station selector switch includes a coaxial shaft assembly with the outer shaft being used to manipulate the movable member of a rotary step switch for station selection. This movable member includes a rotatable contact ring which is insulated from the shaft assembly and which serves the dual purpose of selectively establishing circuits to the tuning elements in the various channels of the oscillator section of the tuner and also functioning as one plate of a trimmer capacitor common to all channels. The other plate of the trimmer is movable axially of the shaft assembly, on which it is mounted by the inner of the coaxial shaft assembly. The inner shaft has a worm-like portion with a ball follower that drives the movable plate of the trimmer.

The entire arrangement is compact, inexpensive and otherwise highly advantageous, as will be particularly pointed out hereinafter.

Figure 1:
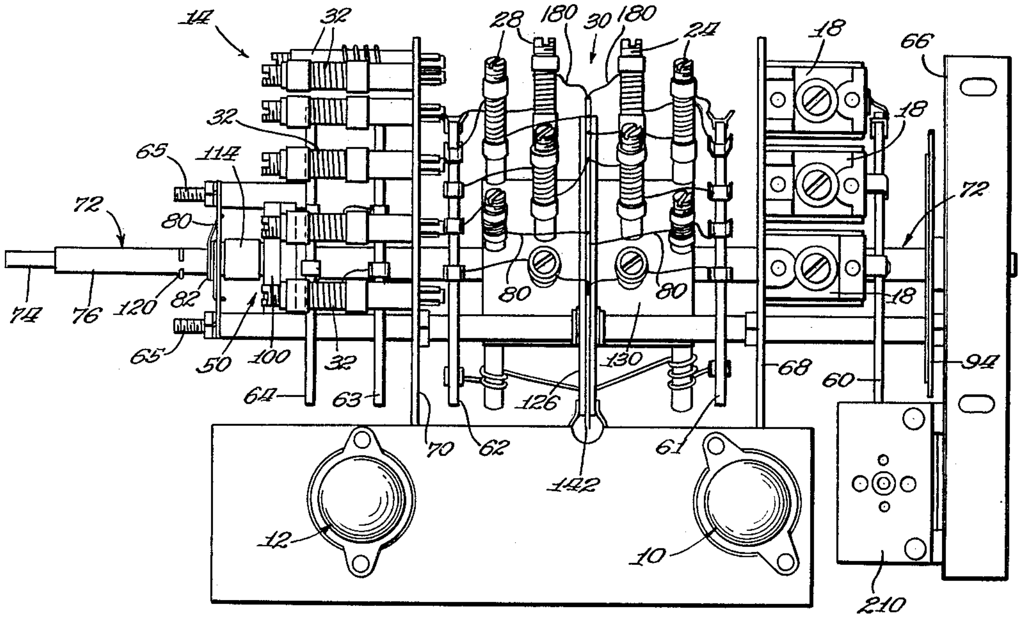
Fig. 1 is a side elevational view of a tuner constructed in accordance with and embodying the invention.
Figure 4:
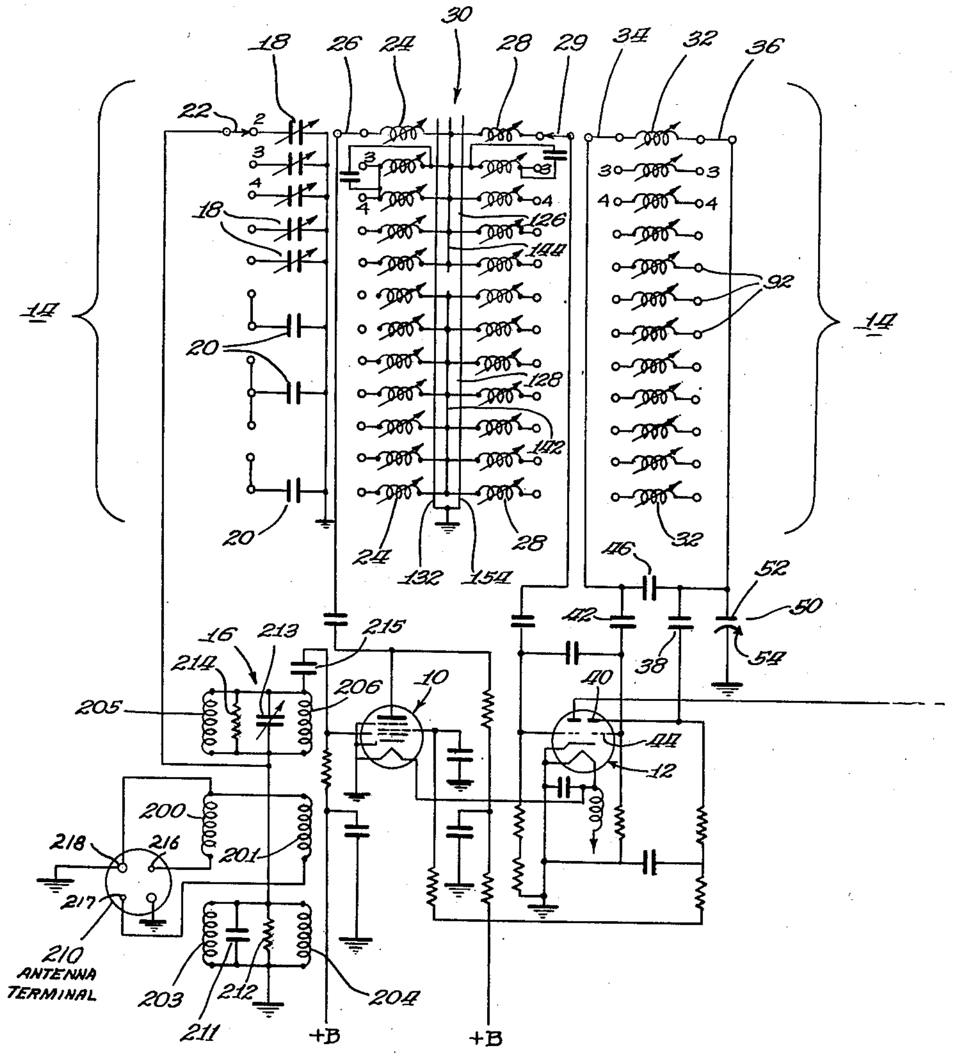
Fig. 4 is a schematic diagram showing the tuner as it is associated with the radio frequency and mixer stages of a television receiver.

Referring now to the drawings, Fig. 1 illustrates the structure of the multirange tuner and Fig. 4 illustrates the superheterodyne receiver circuit. The tuner includes a ratio frequency amplifier 10 and a mixer-oscillator 12. Associated with these two stages of the receiver are certain tuning elements of the tuner, designated generally 14, and a tuned input circuit 16. Any one of the preadjusted trimmer capacitors 18 or the fixed capacitors 20 may be selected for inclusion in the tuned circuit 16 as an incident to setting of the movable contactor 22 in the tuner 14. As indicated in Fig. 4, this contactor 22 may occupy any of a plurality of positions such as those respectively designated by the numerals 2, 3 and 4, corresponding to the standard television channels.

The radio frequency amplifier 10 also has a tuned output circuit in which may be included any of a series of variable inductors 24 which are selected by means of a movable contactor 26 and the corresponding one of another series of tuning inductors 28 selected by operation of contactor 29. A fixed capacitor unit 30 couples the inductors 24 and 28 to provide a double tuned circuit. This capacitor unit will be described in greater detail hereinafter.

Still another series of tuning inductors 32 is associated with the oscillator section of the oscillator-mixer 12, and cooperating with this series of inductors 12 are the movable contactors 34 and 36. The contactor 36 couples the selected one of the inductors 32 through a coupling capacitor 38 to the plate 40 of the oscillator-mixer 12. The contactor 34 is in the feedback path of the oscillator and is coupled by the capacitor 42 to the grid 44 of the oscillator-mixer 12. A fixed capacitor 46 cooperates with the selected tuning inductor 32 to provide a tank circuit for the oscillator section of the oscillator-mixer 12.

All of the movable contactors 22, 26, 29, 34 and 36 are ganged together and constitute the movable center portion of a rotary step switch (which will be described in greater detail presently). To select a particular station, these contactors are moved into a position (such as 2, 3, or 4) corresponding to that station. This effects a coarse tuning of the receiver.

Figure 8:
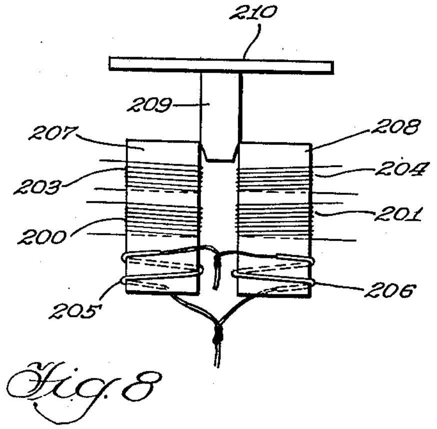
Fig. 8 is a detail illustrating the antenna coupling coil.

Considering now the antenna coupling circuit 16 more in detail, this circuit includes primary windings 200 and 201 connected to contacts 216, 217 and 218 of the terminal board 210. The terminal contacts are arranged so that the coils 200 and 201 may be connected in series by connecting to contacts 216 and 217, or in parallel by interconnecting contacts 216 and 217 and connecting to contact 218, as desired. Individually coupled to the coils 200 and 201 are low frequency secondary coils 203 and 204 and high frequency secondary coils 205 and 206. As best shown in Fig. 8, the coils 200, 203 and 205 are on coil form 207 so that they are in inductive relationship with each other, and the coils 201, 204 and 206 are on a second coil form 208 in inductive relationship with each other. The two coil forms 207 and 208 are supported by a bracket 209 secured to the antenna terminal board 210 which is in turn supported on the frame plate 66.

The coils 203 and 204 are connected in parallel with each other and in parallel with capacitor 211 and resistor 212 to form a parallel resonant circuit. Similarly, the coils 205 and 206 are connected in parallel with each other and with adjustable capacitor 213 and resistor 214 to form a second resonant circuit. The first resonant circuit is tuned to be responsive to the low frequency television range and the second resonant circuit is tuned to be responsive to the high frequency television range. The inductance values required for resonance at the very high frequencies involved are very small. This is particularly true in the high frequency resonant circuit. However, the inductance of the coils 203–206 inclusive, is made larger as in each case two coils are provided in parallel. This facilitates construction of the coils as the coils are not so small and the exact length thereof is less critical. Also, increased coupling between the primary and secondary circuits is provided as the coupling produced by the two primary coils and the two secondary coils for either low or high frequency operation is additive.

The two resonant circuits are connected in series to the input circuit of radio amplifier 10, being connected thereto by capacitor 215. When operating in the low frequency range, the high frequency resonant circuit is of little effect and may be disregarded. For such operation, fine tuning of the low frequency resonant circuit is provided by the capacitors 18 which are selectively connected to the common connection between the resonant circuits by movable contactor 22. The various capacitors 18 may be adjusted to provide proper tuning for the individual channels on the low frequency range. When operating in the high frequency range, the low frequency resonant circuit is very material and must be rendered ineffective. This is accomplished by connecting one of the capacitors 20 to the low frequency resonant circuit during operation on each channel in the high frequency range. The capacitors 20 are of such value that they resonate out the low frequency secondary coils, effectively short-circuiting the coils so that the high frequency circuit is in effect connected to ground. Tuning of the high frequency resonant circuit is provided by the adjustable capacitor 213. Satisfactory operation is obtained by one setting of this capacitor for the entire band and, therefore, provision for adjustment of the individual channels is not necessary.

In operation over wide frequency ranges as required for television, the input impedance of the radio frequency amplifier tube 10 is variable through a relatively wide range of values. This impedance is reflected from the secondary coils to the primary coils and changes the effective impedance of the secondary coils resulting in improper matching between the coils and the antenna to which they are connected. By providing loading resistors 212 and 214 in the resonant circuits, the effect of the variation of impedance of the radio frequency amplifier tube may be minimized.

Figure 2:
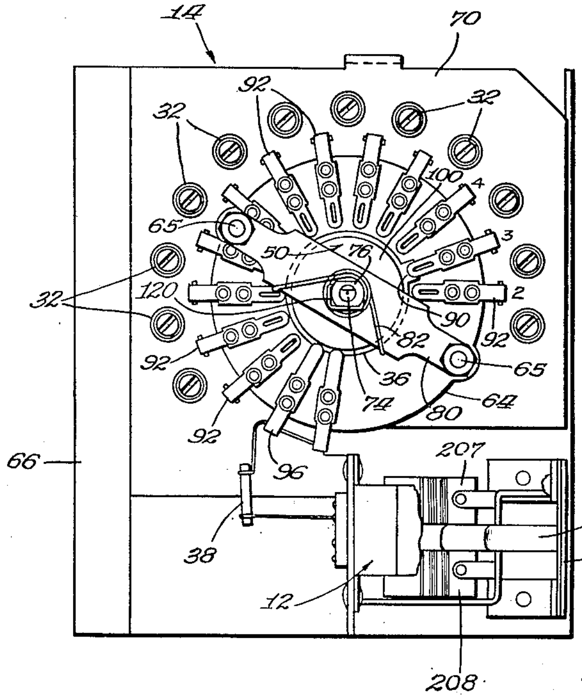
Fig. 2 is a front elevational view of the tuner.
Figure 3:
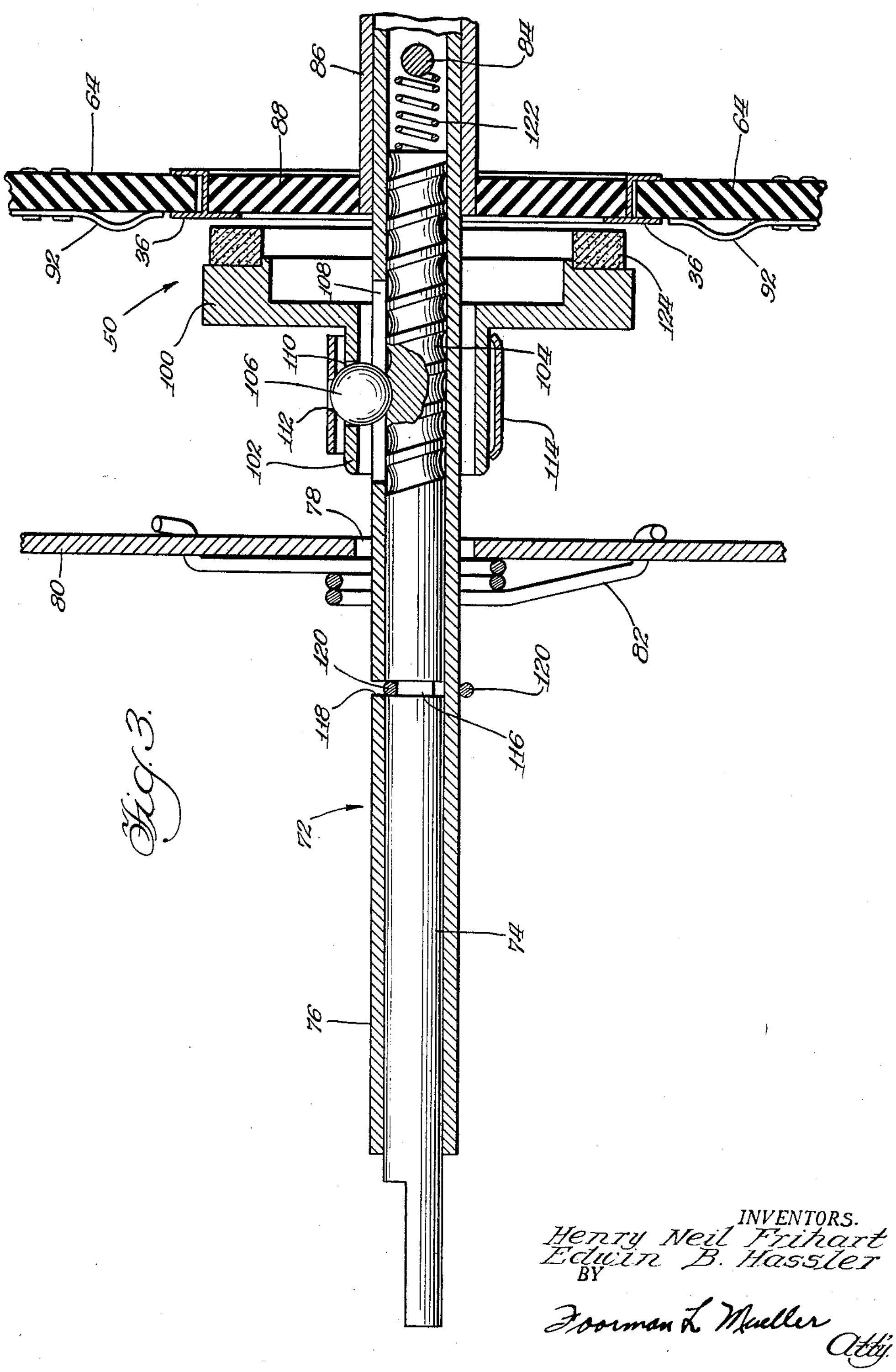
Fig. 3 is a longitudinal section through the oscillator trimmer portion of the tuner.

Figs. 1, 2 and 3 illustrate a preferred mechanical construction of the novel tuner. Fig. 1 shows the relative locations of the various tuning elements. These elements may readily be identified by comparison thereof with the like-numbered parts in Fig. 4. Mounted on insulating plates 60, 61, 62, 63 and 64 are the various stationary contacts which are respectively engageable by the contactors 22, 26, 29, 34 and 36. These insulating plates are mounted on conventional posts or studs 65 that are anchored in the various frame plates 66, 68 and 70 of the tuner mechanism.

A shaft assembly designated generally 72 extends centrally through the various switch plates 60 to 64. The forward end of this shaft assembly 72 comprises an inner shaft 74 and an outer coaxial shaft 76 which is sleeved on the shaft 74, Fig. 3. The shaft 76 has two flat sides (as shown best in Fig. 2) and is adapted to receive a tuning knob (not shown) on its forward end. The inner shaft 74 is generally round except at its extreme forward end, where it is flattened to receive a second knob (not shown) for vernier adjustment. Thus, the two tuning knobs are mounted on a common shaft assembly. The two shafts 74 and 76 extend through a clearance opening 78 (Fig. 3) in a small strip 80 that is mounted at its ends on the studs 65. A piece of spring wire 82 is anchored on the piece 80 and twisted for a few turns around the shaft assembly 72 to prevent the shaft assembly from wobbling and also to insure grounding of the shaft assembly. The outer shaft 76 is adapted to simultaneously operate the movable contactors included in the tuner mechanism. The inner shaft 74 operates only the oscillator trimmer 50.

As shown in Fig. 3, the outer shaft 76 extends through the trimmer 50 and is connected by a pin 84 to an outer shaft extension 86. Secured on the shaft extension 86 (which has flattened sides) so as to rotate with the outer shaft 76 is an annular insulating member 88 which carries the ring-shaped contactor 36. The contactor ring 36 has a small tail or tap 90 which successively wipes the stationary contacts 92, Fig. 2, as the ring 36 is rotated. A conventional jockey disc 94 (Fig. 1) mounted on the shaft assembly 72 serves as a detent for accurately positioning the tap 90 with respect to each of the stationary contacts 92. All of the switching devices 60–64 are constructed in similar fashion. Details of the switch mechanism are not important, so long as the inventive principles pointed out herein are followed.

As is apparent from Fig. 1, the inductors 24 and 28 and the capacitor unit 30 are mounted on a cylindrical supporting member 130 positioned about the shaft assembly 72. As may be seen by reference to Fig. 4, the fixed capacitor unit 30 associated with the tuning inductors 24 and 28 of the tuner has two component parts, namely, the capacitor 126 and the capacitor 128. The capacitor 126 is common to a plurality of the lower television channels, while the capacitor 128 is common to a plurality of upper television channels. Each of these capacitors has a value which is optimum for its particular band. By way of example, the capacitor 126 may have the value of 225 micromicrofarads, and the capacitor 128 may be 150 micromicrofarads.

Figure 5:
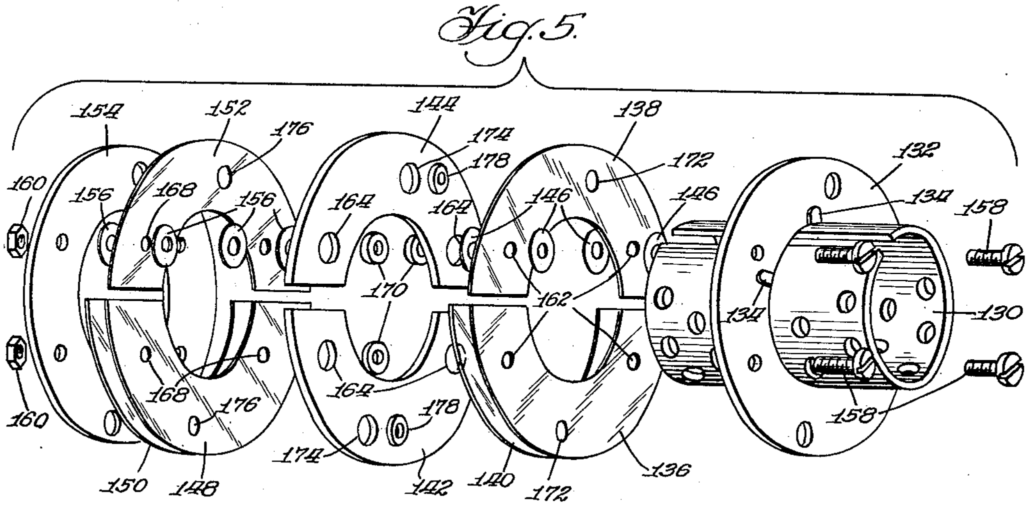
Fig. 5 is an exploded perspective view of a fixed capacitor unit employed in the radio-frequency section of the tuner.
Figure 6:
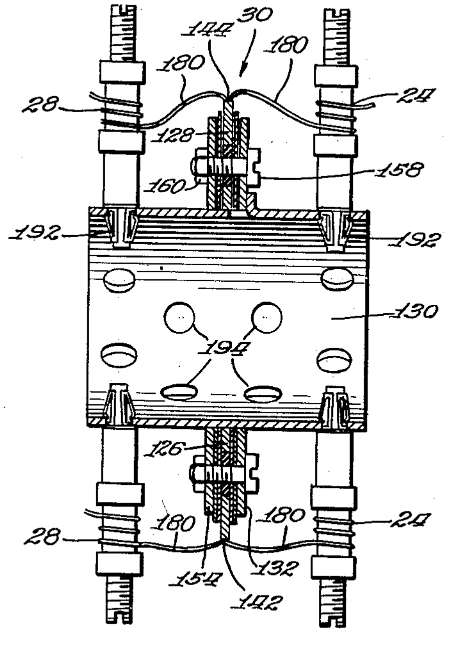
Fig. 6 is a longitudinal section through the radio-frequency portion.

The detailed construction of the capacitor unit 30 is best shown in Figs. 5 and 6. The inductors 24 and 28 are mounted on a cylindrical supporting member or collar 130, and the capacitor unit 30 is disposed on the collar 130 intermediate these two sets of inductors. The unit 30 has an annular outer or end plate 132 which is soldered or otherwise secured to lugs as 134 that are struck outwardly from the collar 130. Adjacent to the end plate 132 are two semi-annular segments 136 and 138 of insulating material such as mica positioned in complementary fashion. Adjacent to the mica sheet 136 is another semi-annular insulating segment 140. The insulating sheets or segments 136, 138 and 140 are interposed between the end plate 132 and a pair of semi-annular metallic inner plates 142 and 144. The plate 142 is disposed adjacent to the insulating segments 136 and 140 and constitutes one plate of the capacitor 126 in the lower band of television channels. The other plate 144 is part of the capacitor 128 in the upper band of television channels. The insulating segment 138 is disposed between the inner plate 144 and the end plate 132 but is spaced therefrom by mica washers such as 146.

On the other side of the inner plates 142 and 144 (which respectively are included in the capacitors 126 and 128) are insulating sheets or semi-annular segments 148, 150 and 152 and a metallic end plate 154. The juxtaposed segments 148 and 150 separate the inner plate 142 from the end plate 154 and are included in the capacitor 126. The segment 152 is spaced from the plates 144 and 154 by mica washers such as 156 and is part of the capacitor 128. The different proportions of mica and air dielectric in the capacitors 126 and 128 give different capacities for these elements.

This capacitor assembly is held together by screws 158 and nuts 160 threaded thereon, only two of these pairs being shown in Fig. 5. Clearance openings 162, 164 and 168 are provided in the mica sheets and inner plates to accommodate the screws 158. The holes 164 in the inner plates 142 and 144 have relatively large diameters, and fiber insulating washers 170 are disposed in these holes, whereby the shanks of the screws 158 are spaced and insulated from these inner plates. The screws 158 pass through the insulating washers 146 and 156 in addition to the other clearance openings.

The posts 65 (Figs. 1 and 2) likewise pass through the capacitor unit 30 and support the same. Various clearance openings 172, 174 and 176 are provided in the various insulating sheets and the inner plates of the capacitor to accommodate these posts. Mica washers as 146 and 156 may also be disposed on these posts, and fiber washers as 178 are disposed in the holes 174 for insulating the inner plates 142 and 144 from the posts.

The capacitor unit 30, when assembled, is very compact and conserves space, as can be seen in Figs. 1 and 6. The inner plates 142 and 144 project radially outward for a short distance from the remainder of the unit 30 and are disposed in proximity to the tuning inductors 24 and 28. Various leads 180 extend from these inductors directly to the condenser plates 142 and 144 by the shortest routes and are soldered thereto at spaced points on the outer peripheries of these plates. Therefore the coupling between the inductors 24 and 28 which are connected at any time is provided only by the capacitor unit 30 and, as no leads are required and the capacitor plates are relatively heavy, there is substantially no inductive coupling. The coupling therefore does not change with frequency. This arrangement also has the advantage that it is inexpensive to manufacture, the cost being much less than that of a comparable capacitor unit constructed in a conventional manner.

Figure 7:
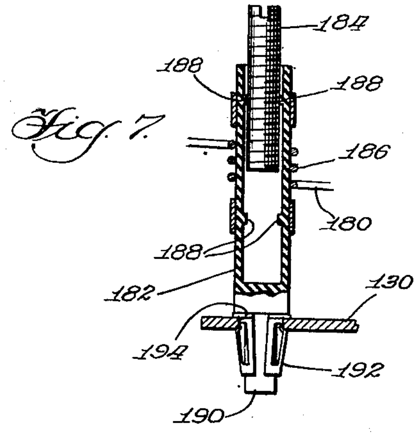
Fig. 7 is a sectional detail view of a tuning inductor.

Fig. 7 illustrates in section a typical tuning inductor such as may be employed in the illustrated tuner. The inductor has a shell or tube 182 of suitable dielectric material such as polystyrene. A threaded tuning slug or core 184 is disposed inside of the tube 182. The wire 180 is wrapped for several turns on the outside of the tube 182 to form a coil 186. The core 184 is disposed in the magnetic field of the coil 186, and by varying the position of the core 184, the inductance of the device may be varied. Integral projections 188 are provided on the interior wall of the tube 182 for cooperation with the threads of the core 184 so that this core may be screwed into or out of the magnetic field. One end of the coil 186 is connected by the lead 180 to the capacitor unit 30. The other end of the wire serves as a lead for connecting the coil 186 to an appropriate switch contact, as indicated in Fig. 1.

The base portion 190 of the dielectric tube 182 is reduced in diameter, and a suitable snap-fastener clip 192 is disposed thereon. This portion of the inductor is inserted in an aperture such as 194 in a supporting member such as the collar 130, the clip 192 serving to anchor the inductor in place. The inductors 24 and 28 are disposed in radially extending fashion around the periphery of the collar 130 close to the capacitor unit 30, as previously explained.

For fine tuning a vernier is desired, and in the present instance this is obtained by the use of a trimmer capacitor 50 which is common to all of the channels or stations. The trimmer 50 has a plate 52 which has a permanent electrical connection to (or is identical with) the contactor 36. The other plate 54 of the trimmer 50 is grounded and is adjustable toward or away from the plate 52 for varying the capacitance of the trimmer 50. After selection of a station has been effected by adjustment of the rotary switch elements, the trimmer 50 is employed for accurately adjusting the resonant frequency of the oscillator circuit until the difference-frequency which appears in the output of the oscillator-modulator 12 corresponds exactly to the intermediate frequency of the receiver.

The ring contactor 36 is connected electrically to one side of the coupling capacitor 38, Fig. 4. As shown in Fig. 2, this is accomplished by arranging a stationary contact 96 so that it bears constantly on the ring 36. A lead from the capacitor 38 is soldered to the stationary contact 96, and the other lead from this capacitor is connected to the appropriate terminal of the oscillater-mixer 12. Thus it will be seen that the contactor 36 functions to connect the coupling capacitor 38 selectively with the terminals or stationary contacts 92 according to the station or frequency channel which is being selected. The stationary contacts 92 are respectively connected to the tuning inductors 32, which are mounted on the frame plate 70 around the periphery of the insulating discs 63 and 64. The disc 63 supports a switching device which includes the movable contactor 34 (Fig. 4).

In addition to functioning as a part of a switch for selectively connecting the tuning inductors 32 in circuit with the oscillator-mixer 12, the contactor ring 36 also serves as one plate (52, Fig. 4) of the trimmer 50. The other plate 54 of the trimmer 50 consists of an annular metallic member 100 (Figs. 1–3) having a small extension or collar portion 102 which is slidingly mounted on the outer shaft 76 of the shaft assembly 72. The movable plate 100 is disposed between the insulating plate 64 and the strip 80.

In order to move the plate 100 axially toward and from the other plate 36 of the trimmer 50, the inner shaft 74 is formed with a threaded worm portion 104, Fig. 3, with which a ball follower 106 cooperates. The ball 106 is received in a longitudinal slot 108 in the outer shaft 76 and in a hole 110 in the sleeve 102, and it seats also in a smaller hole 112 in a spring clip 114 which embraces the sleeve 102. The clip 114 holds the ball 106 against the worm 104, and as the inner shaft 74 is rotated relative to the outer shaft 76, the capacitor plate 100 is caused to move axially of the shaft assembly 72. To prevent relative axial movement of the two shafts 74 and 76, these shafts are formed respectively with an annular groove 116 and a corresponding slot 118, which are adapted to register with each other. A wire clip 120 seated in the slot 118 and groove 116 prevents the inner shaft 74 from being moved axially relative to the outer shaft 76. A small coil spring 122 is interposed between the pin 84 and the rear end of the inner shaft 74, and if desired, an anti-friction ball-bearing (not shown) may be interposed between the spring 122 and the end of the shaft 74.

The plate 100 is grounded to the shaft assembly 72, while the plate or ring 36 is insulated from ground by the insulating member 88. An insulating ring 124 is secured to the face of the plate 100 to prevent the plates 36 and 100 from directly contacting each other. The plate 100 is capable of moving axially in either direction until either the sleeve 102 or the ring 124 strikes an obstruction. Further rotation of the shaft 74 merely causes the ball 106 to ride over the threads of the worm 104, the spring clip 114 yielding sufficiently to permit this.

The operation of this part of the tuner is believed to be apparent from the foregoing description. The outer dial or knob of the tuning control is adjusted to the desired position for selecting a particular channel or station. Then the inner knob or dial is turned to effect a fine adjustment by means of the vernier arrangement described above. The novel construction of the oscillator trimmer 50 affords a fine tuning control which uses only one vernier dial for the various channels, and it keeps stray reactances at a minimum. The structure is simple and inexpensive, and it greatly improves the performance and utility of the television receiver.

The novel arrangement of the capacitor 30, tuning inductors as 24 and 28, rotary switches as 64 and the oscillator trimmer 50 affords many advantageous features as mentioned hereinabove. Other advantages of this improved construction not specifically described herein may occur readily to others skilled in the art. It should be understood that the preferred embodiment of the invention herein disclosed is merely illustrative and is not intended to limit in any way the scope of the invention as set forth in the appended claims.

We claim:

1. In a tuner for an electronic receiver of the type wherein a rotary switch mechanism and a supporting frame are positioned about a central shaft assembly and in which the switch mechanism includes fixed contacts and associated movable contacts actuated by the shaft assembly; a plurality of tuning inductors supported on said frame, means connecting said tuning inductors to certain of said fixed contacts, said movable contacts selectively connecting said inductors to tune said receiver to predetermined channels, a coupling capacitor comprising first and second plates, means securing said first plate to said frame and insulatedly securing said second plate to said first plate, means connecting certain of said inductors together in pairs and connecting the common connection of said pairs to said second plate, an adjustable capacitor cooperating with certain other of said inductors for fine tuning purposes, said adjustable capacitor including one of said movable switch contacts and a conducting plate and means for electrically connecting said conducting plate to said frame and for mechanically connecting said conducting plate to said shaft assembly for moving said conducting plate with respect to said one movable switch contact.

2. An assembly of capacitive and inductive elements for a television tuner comprising, a cylindrical supporting member, a plurality of tuning inductors mounting means for securing said inductors to said supporting member at circumferentially spaced points thereon, and an annular fixed capacitor unit positioned about said supporting member in proximity to said inductors, said capacitor unit comprising an annular metallic plate, means securing said metallic plate to said supporting member and electrically connecting the same thereto, a dielectric sheet disposed adjacent to said metallic plate, and a second metallic plate disposed adjacent said dielectric sheet, means insulatedly connecting said second metallic plate to said annular metallic plate and means affording electrical connections between said inductors and spaced points on the periphery of said second plate respectively disposed adjacent to said inductors.

3. An assembly of capacitive and inductive elements for a television tuner comprising a cylindrical supporting member, a plurality of tuning inductors mounted on said supporting member at circumferentially spaced points thereon, said inductors having inductance values required for tuning to television channels in different frequency ranges, and an annular fixed capacitor unit positioned about said supporting member in proximity to said inductors, said capacitor unit including an annular metallic plate, and a plurality of additional metallic plates each of which is a section of an annular plate, dielectric means interposed between said annular plate and said additional plates, said inductors being respectively connected electrically to adjacent points on the peripheries of the associated additional plates.

4. In a wave signal apparatus having a plurality of sets of tuning elements each allocated to a particular frequency channel, the combination of a manually actuatable shaft assembly including a pair of coaxial relatively rotatable shafts, a channel-selecting switch structure including a rotary contact element means for mounting said contact element on a first one of said shafts for rotation therewith, a variable capacitor including said rotary contact element and a second capacitor plate, and a mechanical coupling connecting said second plate to the second of said shafts for imparting axial movement to said second plate when said second shaft is rotated relative to said first shaft.

5. In a high-frequency tuner having a plurality of tuning inductors allocated to various frequency channels, together with tuning capacitors adapted to be connected in circuit with the inductors, the combination of a channel-selecting switch for selectively connecting the capacitors in circuit with the inductors, an adjustable trimmer capacitor, and means connecting said trimmer capacitor in circuit with certain of the tuning capacitors, said switch having an electrically conductive part which also forms a plate of said capacitor.

6. In a tuning device having reactance elements arranged in a plurality of frequency channels, a shaft assembly comprising a pair of relatively rotatable coaxial shafts, a rotary channel-selecting switch including a contact element means mounting said contact element on one of said shafts for rotation therewith for selectively connecting the reactance elements in any of the channels, a capacitor including first and second plates, said second of said shafts including a threaded portion thereon, means engaging said first plate and said threaded portion for causing said first plate to move axially as the second of said shafts is turned relative to said first shaft, and means connecting said second plate to said switch for connecting said capacitor to the reactance elements selected by said switch.

7. In a television tuner having tuning elements arranged according to the respective television channels, a shaft assembly comprising a pair of relatively rotatable coaxial shafts, a rotary step switch having a rotatable portion and a series of stationary contacts arranged in arcuate fashion around said rotatable portion, conductor means individually connecting the tuning elements corresponding to the various channels to said stationary contacts, mounting means connecting said rotatable portion to the outer one of said shafts, a contact member, means supporting said contact member on said rotary portion in a position engageable with any of said stationary contacts for selectively rendering the tuning elements in any of said channels effective, a capacitor plate disposed on said shaft assembly, means interconnecting said capacitor plate and said inner shaft of said shaft assembly for moving said capacitor plate axially along said shaft assembly toward and away from said contact member in response to rotation of said inner shaft, said capacitor plate and said contact member constituting a capacitive trimmer common to all of the channels, and drive means operatively interposed between the inner one of said shafts and said capacitor plate.

8. In a television tuner having tuning elements arranged according to the respective television channels, a shaft assembly including a pair of relatively rotatable coaxial shafts, a trimmer capacitor for modifying the action of the tuning elements in any of the channels, said trimmer capacitor being disposed on said shaft assembly and including relatively movable capacitor plates spaced axially of said shaft assembly, screw-threaded drive means connected to one of said shafts and to one of said capacitor plates and actuated by said one shaft for producing axial movement of said one capacitor plate, thereby to vary the capacitance of said trimmer capacitor, a rotary step switch and means connecting the other of said shafts to said step switch for selectively placing said trimmer capacitor in circuit with the tuning elements in any of the channels.

9. In a television tuner having tuning elements arranged according to the respective television channels, a shaft assembly including a pair of relatively rotatable coaxial shafts, a rotary step switch having an annular contact member, means mechanically connecting said contact member to the outer one of said shafts for rotation therewith, an annular capacitor plate mounting means supporting said capacitor plate on said shaft assembly in axially slidable relation relative to said rotatable contact member, said mounting means holding said capacitor plate against rotary movement relative to said outer shaft, a worm thread formed on the inner one of said shafts, and a worm follower engaging said capacitor plate whereby movement of said inner shaft relative to said outer shaft causes said capacitor plate to shift relative to said contact member, said switch connecting the capacitive reactance between said capacitor plate and said contactor member selectively in circuit with the tuning elements in any of the various channels depending upon the switch position.

10. In a television tuner having tuning elements arranged according to the respective television channels, a shaft assembly including a pair of relatively rotatable coaxial shafts, a rotary step switch means connecting said rotary step switch to the outer one of said shafts for selectively rendering effective the tuning elements in any particular channel, and a trimmer capacitor adapted to be placed selectively in circuit with the tuning elements in any of said channels, said trimmer comprising a rotary contact member included in said switch and a capacitor plate mounting means supporting said capacitor plate on said shaft assembly in spaced relation to said contact member, said mounting means holding said plate slidingly and non-rotatably with respect to said outer shaft, a worm thread on the inner one of said shafts, and a follower engaging said capacitor plate and said worm thread whereby rotation of said inner shaft relative to said outer shaft causes the capacitance of said trimmer to vary.

11. In a tuner for a television receiver adapted to operate in two frequency ranges, an antenna coupling circuit comprising, a transformer including two separate coil forms, a pair of primary coils individually wound on said coil forms, a pair of low frequency secondary coils individually wound on said forms on one side of said primary coils, a pair of high frequency secondary coils individually wound on said forms on the other side of said primary coils, means connecting said low frequency secondary coils in parallel with each other, means connecting said high frequency secondary coils in parallel with each other, and means connecting said low frequency secondary coils in series with said high frequency secondary coils.

12. In a tuner for a television receiver adapted to operate in two frequency ranges, an antenna coupling circuit comprising, a transformer including two separate coil forms, two primary coils individually wound on said coil forms, a pair of low frequency secondary coils individually wound on said forms on one side of said primary coils, a pair of high frequency secondary coils individually wound on said forms on the other side of said primary coils, first and second capacitors, conductor means connecting the coils of each pair in parallel with each other and with one of said capacitors to form first and second resonant circuits, and means connecting said resonant circuits in series.

13. In a tuner for a television receiver adapted to operate in the low frequency and high frequency television ranges, an antenna coupling circuit comprising, a transformer including two separate coil forms, two primary coils individually wound on said coil forms, a pair of low frequency secondary coils individually wound on said forms on one side of said primary coils, a pair of high frequency secondary coils individually wound on said forms on the other side of said primary coils, a low frequency resonant circuit including said low frequency secondary coils connected in parallel, a high frequency resonant circuit including said high frequency secondary coils connected in parallel, conductor means connecting said resonant circuits in series, a plurality of capacitors, and switch means for selectively connecting said capacitors to the common connection between said resonant circuits, certain of said capacitors being effective to tune said low frequency resonant circuit during operation on said low frequency range and the other of said capacitors effectively short-circuiting said low frequency resonant circuit during operation on said high frequency range.

14. In a tuner for a television receiver adapted to operate in the low frequency and high frequency television ranges, an antenna coupling circuit comprising, a transformer including two separate coil forms, a pair of primary coils individually wound on said coil forms, a pair of low frequency secondary coils individually wound on said forms on one side of said primary coils, a pair of high frequency secondary coils individually wound on said forms on the other side of said primary coils, first and second capacitors, first and second resistors, a low frequency resonant circuit including said first capacitor, said first resistor and said low frequency secondary coils connected in parallel, a high frequency resonant circuit including said second capacitor, said second resistor and said high frequency secondary coils connected in parallel, conductor means connecting said resonant circuits in series, a plurality of additional capacitors and switch means for selectively connecting said additional capacitors to the common connection between said resonant circuits, said additional capacitors being effective to tune said low frequency resonant circuit during operation on said low frequency range and to effectively short-circuit said low frequency resonant circuit during operation on said high frequency range.

15. A tuner for an electronic receiver comprising a central operating shaft assembly, a supporting frame and a rotary switch mechanism positioned about said central shaft assembly, said switch mechanism including fixed contacts and associated movable contacts, mechanical means connecting said movable contacts to said shaft assembly, a plurality of tuning elements supported on said frame, conductor means individually connecting said tuning elements to certain of said fixed contacts, an antenna coupling circuit connected to one of said fixed contacts, one of said movable contacts selectively connecting said fixed contacts connected to certain of said tuning elements to said one fixed contact to render said antenna coupling circuit responsive to predetermined frequencies, an annular capacitor comprising first and second plates and insulating means between said plates, means connecting said first capacitor plate to said frame, certain other of said tuning elements including a pair of inductors and conducting means connecting said inductors together in pairs and connecting the same to said second capacitor plate, and an adjustable capacitor including a second one of said movable switch contacts and a movable conducting plate, said shaft assembly including means engaging said movable conducting plate for moving the same with respect to said second movable switch contact.

16. A tuner for an electronic receiver comprising a central operating shaft assembly, a supporting frame and a rotary switch mechanism positioned about said central shaft assembly, said switch mechanism including fixed contacts, and associated movable contacts, mechanical means connecting said movable contacts to said shaft assembly, a plurality of tuning elements supported on said frame, conductor means individually connecting said tuning elements to certain of said fixed contacts, an antenna coupling circuit including a pair of primary coils and two pairs of secondary coils positioned in inductive relation with respect to each other, conductor means connecting the secondary coils of each pair in parallel and connecting the two pairs to one of said fixed contacts, one of said movable contacts selectively connecting said fixed contacts connected to certain of said tuning elements to said one fixed contact to render said antenna coupling circuit responsive to predetermined frequencies, an annular capacitor comprising first and second plates and insulating means between said plates, certain other of said tuning elements including a pair of inductors and conducting means connecting said inductors together in pairs and connecting the same to said second capacitor plate, and an adjustable capacitor including a second one of said movable switch contacts and a movable conducting plate, said shaft assembly including means engaging said movable conducting plate for moving the same with respect to said second movable switch contact.

17. A tuner for an electronic receiver including in combination, a rotary switch mechanism having fixed contacts and associated movable contacts, and a control shaft connected to said movable contacts for operating the same, a supporting frame about said control shaft, a plurality of tuning inductors each having two terminals, means supporting said inductors on said frame in spaced relation and grouped in pairs, a coupling unit including a first conductor secured to said supporting frame and extending outwardly therefrom in proximity to said tuning inductors, at least one additional conductor secured to said first conductor, insulating means between said conductors whereby a capacitor is formed therebetween, means interconnecting terminals of said inductors of each of said pairs and connecting the common connection thereof to said coupling unit, and means connecting the other terminals of said inductors to fixed contacts of said switch assembly whereby one pair of said inductors is selected by said movable contacts of said switch assembly and the selected pair is coupled through said coupling unit.

18. A tuner for an electronic receiver including in combination, a rotary switch mechanism having fixed contacts and associated movable contacts, and a control shaft connected to said movable contacts for operating the same, a cylindrical supporting frame about said control shaft, a plurality of elongated tuning inductors grouped in pairs and having terminals at each end thereof, a coupling unit including an annular conductor positioned about said supporting frame intermediate the ends thereof and mechanically and electrically connected thereto, means supporting said inductors on said frame with said inductors being spaced about said frame and extending radially therefrom, and the inductors of each pair being on opposite sides of said annular conductor, at least one additional conductor secured to said annular conductor, insulating means between said conductors whereby a capacitor is formed therebetween, means interconnecting the remote terminals of said inductors of each of said pairs and connecting the common connection thereof to said coupling unit, and means connecting the other terminals of said inductors to fixed contacts of said switch assembly whereby one pair of said inductors is selected by said movable contacts of said switch assembly and selected pair is coupled to said frame structure through said coupling unit.

19. A tuner for an electronic receiver including in combination, a rotary switch mechanism having fixed contacts and associated movable contacts, and a control shaft connected to said movable contacts for operating the same, a supporting frame about said control shaft, a plurality of elongated tuning inductors having terminals at either end thereof, means supporting said inductors in spaced radially extending position on said frame and a coupling unit including a first conducting plate mechanically and electrically connected to said supporting frame and extending outwardly therefrom intermediate the ends of said frame, at least one additional conducting plate secured to said first plate, insulating means between said first plate and said additional plate whereby a capacitor is formed therebetween, said inductors being grouped in pairs with the inductors of each pair being positioned on opposite sides of said coupling unit, means interconnecting the remote terminals of said inductors of each of said pairs and connecting the common connection thereof to said additional plate, and means connecting the other terminals of said inductors to fixed contacts of said switch assembly whereby one pair of said inductors is selected by said movable contacts of said switch assembly and the selected pair is coupled to said frame structure through said capacitor.

20. In a tuning device having reactance elements of the values required for tuning to a plurality of frequency channels, the combination including, a rotary step switch having a plurality of fixed contacts and at least one movable contact selectively engaging said fixed contacts, means individually connecting said reactance elements to said fixed contacts, and an auxiliary capacitor including said movable contact as one conductor thereof, said movable contact selectively connecting said capacitor to the reactance element connected to the fixed contact engaged by said movable contact.

HENRY NEIL FRIHART.
EDWIN B. HASSLER.

REFERENCES CITED

The following references are of record in the file of this patent:

UNITED STATES PATENTS

| Number | Name | Date |
|---|---|---|
| Re. 22,087 | Albright | May 5, 1942 |
| 1,571,501 | Van Deventer | Feb. 2, 1926 |
| 1,607,856 | Yaxley | Nov. 23, 1926 |
| 2,423,152 | Mitchell | July 1, 1947 |
| 2,427,563 | Lavoie | Sept. 15, 1947 |
| 2,441,028 | Matthews | May 4, 1948 |